United States Patent [19]
Gross

[11] Patent Number: 6,035,181
[45] Date of Patent: Mar. 7, 2000

[54] APPARATUS AND METHOD FOR MAXIMIZING TRANSMIT POWER OUTPUT

[75] Inventor: Joel Lloyd Gross, Chandler, Ariz.

[73] Assignee: Motorola, Inc., Schaumburg, Ill.

[21] Appl. No.: 08/963,318

[22] Filed: Nov. 3, 1997

[51] Int. Cl.[7] .................................................. A61B 1/04
[52] U.S. Cl. .................. 455/127; 455/126; 455/250.1; 455/247.1; 330/51
[58] Field of Search .................. 455/127, 250.1, 455/247.1, 126; 330/51, 151, 133

[56] References Cited

U.S. PATENT DOCUMENTS

| | | | |
|---|---|---|---|
| 4,370,622 | 1/1983 | Hornbeck et al. | 330/207 P |
| 4,392,245 | 7/1983 | Mitama | 455/115 |
| 4,468,665 | 8/1984 | Thawley et al. | 340/856 |
| 4,727,337 | 2/1988 | Jason | 330/298 |
| 5,126,686 | 6/1992 | Tam | 330/134 |
| 5,627,857 | 5/1997 | Wilson | 375/219 |
| 5,828,335 | 10/1998 | Al-dhahir et al. | 342/352 |
| 5,831,477 | 11/1998 | Tsumura | 330/51 |
| 5,873,029 | 2/1999 | Grondahl et al. | 455/126 |

*Primary Examiner*—Daniel S. Hunter
*Assistant Examiner*—Alan T. Gantt
*Attorney, Agent, or Firm*—Harold C. McGurk; Frank J. Bogacz

[57] ABSTRACT

An apparatus (10) and method (100) optimize the transmit output power of a power amplifier (14) while providing for controlled backoff independent of temperature, gain stackup or other common error effects. The apparatus (10) and method (100) are particularly relevant to single channel per carrier (SCPC) satellite transmissions, such as a K-band satellite transmissions. The apparatus (10) and method (100) provide the ability to set a maximum drive level of a power amplifier (14) using a feedback loop without overdriving the power amplifier (14) into compression. This approach controls the spectral regrowth that results from running the power amplifier (14) in saturation and limits the AM/PM conversion in the power amplifier (14).

15 Claims, 1 Drawing Sheet

APPARATUS AND METHOD FOR MAXIMIZING TRANSMIT POWER OUTPUT

FIELD OF THE INVENTION

The present invention relates generally to the field of communication systems and methods, and more specifically, to a satellite communication apparatus and method for controlling transmit output power of a power amplifier.

BACKGROUND OF THE INVENTION

There are many conventional techniques for communicating between satellites or between a satellite and a base station. One of the more common techniques of satellite communications uses a power amplifier. A problem when driving a power amplifier is how to control the transmitted output power while minimizing spectral regrowth due to compression. Due to gain variations from temperature and equipment alignment, the ability to control the power amplifier is compromised.

A conventional technique for controlling the power amplifier is to create a table of how a power amplifier responds to varying conditions of temperature, integration losses, gain values, EOL variances and other effects. The solution however has significant memory, computational and complexity cost. Accordingly, there exists a need for a way to maximize the transmit power of a power amplifier independent of intermediate frequency gain variations, temperature and equipment alignment while minimizing spectral regrowth due to compression of the power amplifier.

DETAILED DESCRIPTION OF THE PREFERRED EMBODIMENT

An apparatus and method described herein optimize the transmit output power of a power amplifier while providing for controlled backoff independent of temperature, gain stackup or other common error effects. The apparatus and method are particularly relevant to single channel per carrier (SCPC) satellite transmissions, such as a K-band satellite transmissions. The apparatus and method provide the ability to set a maximum drive level of a power amplifier without overdriving the power amplifier into compression. This approach controls the spectral regrowth that results from running the power amplifier in saturation and limits the AM/PM conversion in the power amplifier.

Figure 1:
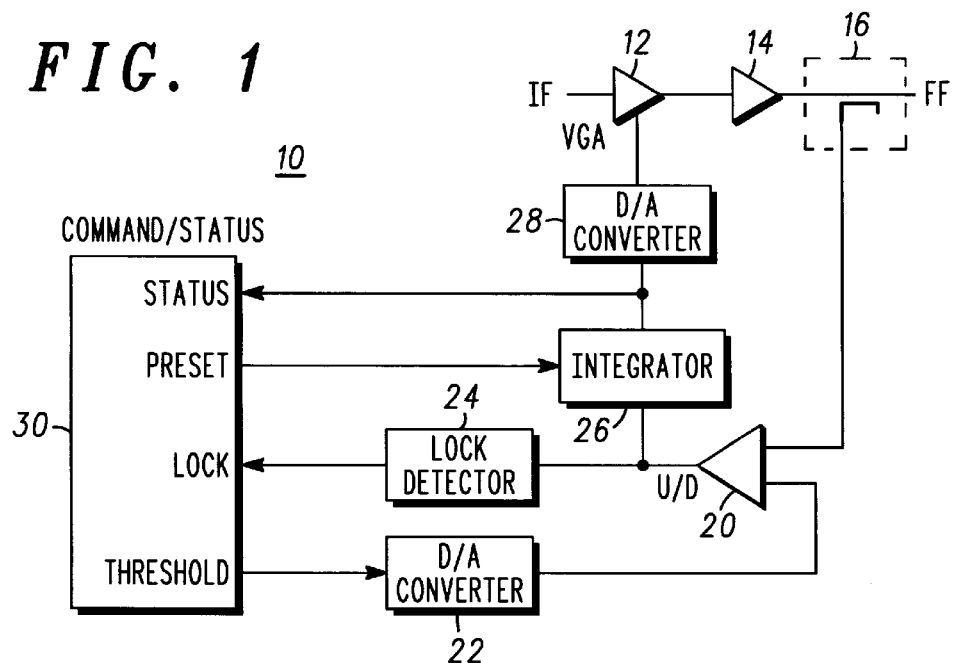
FIG. 1 shows an apparatus that maximizes transmit output power of a power amplifier according to a preferred embodiment of the present invention.

FIG. 1 shows an apparatus that maximizes transmit output power of a power amplifier according to a preferred embodiment of the present invention. As shown in FIG. 1, variable gain amplifier 12 is coupled to receive an intermediate frequency (IF) signal. This IF signal may be provided from a modem, for example. Variable gain amplifier 12 is coupled to power amplifier 14 which in turn is coupled to forward power detector diode 16. Power amplifier 14 is preferably a high power amplifier when power amplifier 14 is used for transmission purposes. Forward power detector diode 16 samples the radio frequency signal which is transmitted to an earth station or to a satellite.

As shown in FIG. 1, there is a feedback loop from the output of power amplifier 14 to gain input to variable gain amplifier 12. The feedback loop, also known as an automatic level control ("ALC") loop, detects whether power amplifier 14 can sustain a transmit power output and sets a power level of power amplifier in response to the feedback.

The power emitted by power amplifier 14 and sampled by forward power detector diode 16 is input to comparator 20. Comparator 20 compares the power output by power amplifier 14 (and detected by forward power detector diode 16) to a power threshold signal provided by processor 30. Processor 30 sets the power threshold signal according to method 100. Processor 30 outputs a digital power threshold signal where it is converted to an analog signal by digital to analog (D/A) converter 22. The result of the power comparison performed by comparator 20 is the state of the ALC loop and is either an "up" or "down" signal to integrator 26. When the comparator output duty cycle is approximately 50% up/down, lock detector 24 indicates that the two power signals are equal (i.e., a "lock" state). Otherwise, lock detector 24 determines that the two power signals are not equal, thus indicative of an "unlock" state.

Integrator 26 also receives the "up" or "down" signal from comparator 20. Integrator 26 selects either to increase a gain value, decrement the gain value or keep the gain value at its current value. The gain value of variable gain amplifier 12 is increased until power amplifier 14 reaches its maximum transmit output power. The gain value output by integrator 26 is provided to processor 30 (via the "status" input). This analog signal representing the gain value is supplied to variable gain amplifier 12, which in turn increases or decreases the power of power amplifier 14, or keeps power amplifier 14 at its current level.

Processor 30 has at least two inputs, "lock" and "status" and two outputs, "preset" and "threshold". The "lock" input of processor 30 as mentioned above receives a signal that indicates whether the ALC loop is locked or unlocked. Based on the "lock" input, processor 30 sets the "threshold" output so that integrator 26 determines whether to increment or decrement the gain value or keep it at the current gain value.

Processor 30 monitors the integrated gain value via the "status" input. The "threshold" output of processor 30 is where processor 30 provides comparator 20 with the power threshold value (so it can be measured against the power output by power amplifier 14).

Variable gain amplifier 12, power amplifier 14, forward power detector diode 16, comparator 20, D/A convertors 22, 28 and processor 30 are well known to those skilled in the art and are commercially available. Lock detector 24 and integrator 26 are preferably part of an ASIC, although those of ordinary skill in the art can build these units using integrated circuits which are commercially available.

Figure 2:
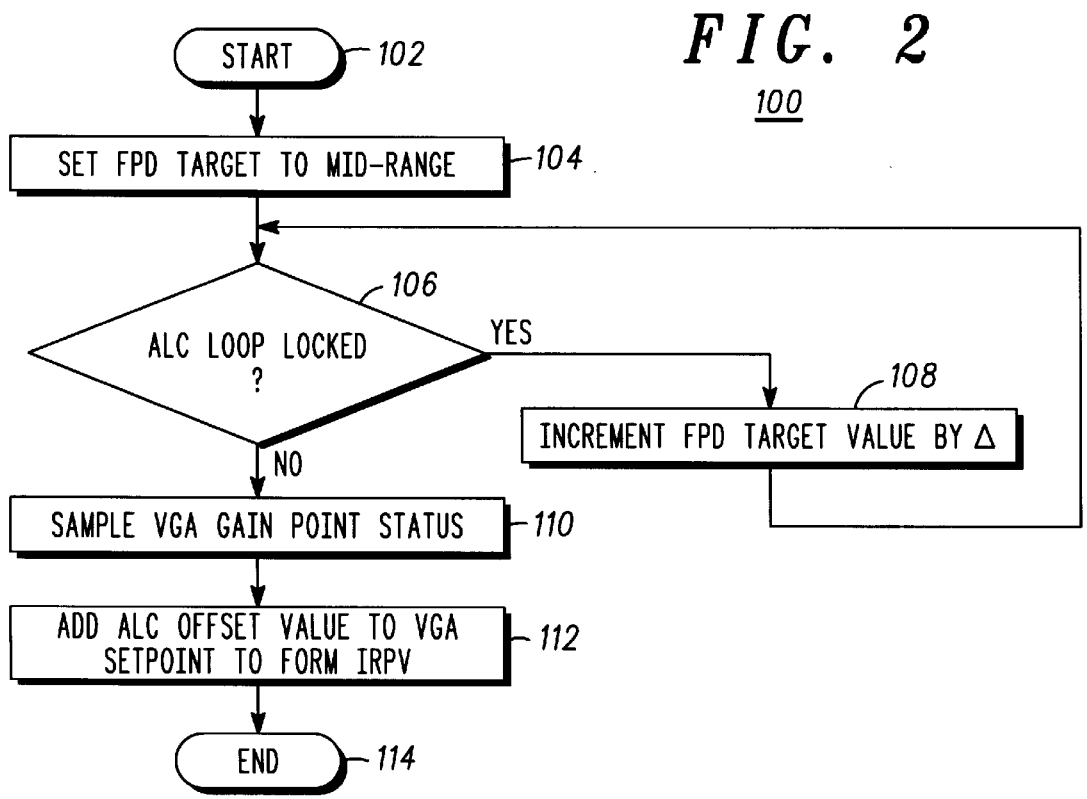
FIG. 2 shows a flowchart of a method of maximizing transmit output power of a power amplifier according to a preferred embodiment of the present invention.

FIG. 2 shows a flowchart of method 100 for maximizing satellite transmit output power according to a preferred embodiment of the present invention. Method 100 finds a maximum IF (intermediate frequency) drive level that sustains closed loop operation and adds a fixed delta to control backoff from a knee point. The knee of the forward power detector diode curve represents where the ALC loop transitions from a locked to unlocked status. Essentially method 100 must detect the knee of the forward power detector diode curve as a function of drive level in order to control spectral regrowth resulting from an overdriven transmit/receive convertor.

Method 100 starts in step 102 when there is a need to transmit data to another satellite or to a base station. In step 104, method 100 sets the forward power detector ("FPD")

target value to a mid-range value. This mid-range value is an approximate value of a mid-range point that is far enough from the knee where the feedback loop will lock. The FPD target value is a digital count value that corresponds to a mid-range dB value. In the preferred embodiment, the FPD target value is set at a count of 150 which corresponds to about 15 dB below the expected knee point. The selection of where to begin the mid-range value is not critical to the operation of method 100, but can be any reasonable starting point that is below the knee point on the forward power detector diode curve. Step 104 is performed by processor 30, where a "threshold" value is set to a mid-range value and provided to integrator 26 which sets the gain value to a mid-range value. This in turn sets the transmit power output of power amplifier 14 to a mid-range value.

Once the FPD target is set, method 100 determines in step 106 whether the ALC loop locked. A lock occurs when lock detector 24 determines from the output of comparator 20 that the power threshold signal matches the power output by power amplifier 14. This means that power amplifier 14 has not reached the knee, can sustain the current level of the transmit power output (as set by integrator 26 and variable gain amplifier 12) and thus, can be driven with more power.

If the ALC loop locked, method 100 then increments the FPD target value in step 108. This is preferably a small amount, typically 1 to 5 counts. However, those of ordinary skill in the art can set the increment to more or less. Integrator 26 is responsible for controling the gain value of variable gain amplifier 12, thereby controlling the power to power amplifier 14. By checking to see whether the ALC loop locked in step 106 and incrementing the FPD target value after each time the ALC loop locked, the power to power amplifier 14 will continue to be incremented until the knee is reached (i.e., power amplifier reaches its maximum sustainable transmit power output). When the knee is reached, the ALC loop transitions from a locked state to an unlocked state, meaning power amplifier is unable to sustain the target transmit power output.

When the ALC loop becomes unlocked, method 100 samples in step 110 the gain value of variable gain amplifier 12. Step 110 is performed by processor 30, which samples the gain value as provided by integrator 26. Once the maximum gain value is found in step 110, an offset is added by method 100 in step 112 to find an initial reference preset value (IRPV). The offset could be either a positive or negative offset. The IRPV is used subsequently as the gain "preset" value of processor 30. The offset value allows the final transmit power to be set slightly above the knee or below the knee as desired. This avoids having to recode the software if slight adjustments are needed for all the satellites.

Once the IRPV has been found for the pass (satellite to earth stations), any subsequent requests to increase or decrease the power are performed against the IRPV. The IRPV becomes the ceiling for any increase requests and also becomes the maximum gain preset value for any commanded power level. Any requests above the IRPV are not honored. Moreover, should the downlink between the satellite and earth station be dropped, the IRPV becomes the value that processor 30 reverts to as the initial transmitted power level.

One of the many advantages of the method and the apparatus is the combination of an algorithmic search and subsequent sample (i.e., step and measure) of available transmit output power and finding a maximum sustainable output power which still maintains closed loop lock.

Another advantage of the apparatus and the method is that power amplifier can be set at its maximum drive level without overdriving the power amplifier into compression. Moreover, another advantage of the method and apparatus is to control the power amplifier independent of intermediate frequency gain variations, temperature and equipment alignment while also minimizing spectral regrowth due to compression of the power amplifier. Yet another advantage of the method and apparatus is to detect the knee of the power amplifier and to precisely backoff from the knee point to maximize the transmit output power so as to limit spectral splatter. A further advantage of the method and apparatus is the ability to periodically sample and make decisions on what should be the maximum usable set point. Another advantage of the method and apparatus is to detect and circumvent potentially failed forward power detector diodes.

The apparatus and method are particularly applicable to low earth orbit satellite systems, where significant temperature variations make predicting the optimal IF drive level into the power amplifier very difficult. The method performed at the beginning of each low earth orbit pass over an earth station, finds an optimal set point and ensures compliance with FCC spectral mask requirements.

Although the preferred embodiments of the invention have been illustrated and described in detail, it will be readily apparent to those skilled in the art that various modifications may be made therein without departing from the spirit of the invention or from the scope of the appended claims.

What is claimed is:

1. A method of maximizing transmit power output of a power amplifier, comprising the steps of:
    a) setting the transmit power output of the power amplifier to a mid-range value;
    b) determining whether the power amplifier can sustain the transmit power output;
       wherein step (b) comprises the step of comparing a transmit power being output by the power amplifier to a threshold power value;
    c) if the power amplifier can sustain the transmit power output, increasing the transmit power output of the power amplifier by a predetermined amount;
    d) repeating steps (b) and (c) until the power amplifier reaches a maximum sustainable transmit power output; and
    e) adding an offset to the transmit power output by the power amplifier by a predetermined amount.

2. A method as recited in claim 1, wherein step (a) comprises the step of setting a forward power detector target value to the mid-range value, the forward power detector target value representing a desired power output of the power amplifier.

3. A method as recited in claim 2, wherein step (c) comprises the step incrementing the forward power detector target value by a predetermined amount.

4. A method as recited in claim 1, wherein step (c) comprises the step of increasing the transmit power output by a predetermined amount if the transmit power output compares to the threshold power value.

5. A method as recited in claim 1, wherein step (d) comprises the step of keeping the transmit power output at its current level if the transmit power output is not equal to the threshold power value which indicates that the power amplifier had reached its maximum sustainable transmit power output.

6. A method as recited in claim 1, wherein step (d) comprises the step of decrementing the transmit power output at if the transmit power output is not equal to the threshold power value which indicates that the power amplifier had reached its maximum sustainable transmit power output.

7. A method as recited in claim 1, wherein step (d) comprises the step of sampling the transmit power output of power amplifier at its current level if the transmit power output is not equal to the threshold power value.

8. An apparatus for maximizing transmit power output, comprising:
   a variable gain amplifier;
   a power amplifier coupled to the variable gain amplifier;
   a forward power detector coupled to the power amplifier;
   a comparator coupled to the forward power detector;
   an integrator coupled to the comparator and the variable gain amplifier;
   a processor coupled to the integrator; and
   said variable gain amplifier receiving an intermediate frequency signal and the power amplifier outputs a radio frequency signal.

9. An apparatus recited in claim 8, further comprising:
   a lock detector coupled to the comparator and the processor; and
   a digital to analog converter coupled to the processor and the comparator.

10. An apparatus recited in claim 9, further comprising:
    a second digital to analog converter coupled to the variable gain amplifier and the integrator.

11. An apparatus recited in claim 8, wherein the processor receives a gain value from the integrator and provides a power threshold signal to the comparator.

12. An apparatus recited in claim 8, wherein the forward power detector samples power output by the power amplifier.

13. An apparatus for maximizing transmit power output, comprising:
    a variable gain amplifier;
    a power amplifier coupled to the variable gain amplifier;
    a forward power detector coupled to the power amplifier for sampling power emitted by the power amplifier;
    a comparator coupled to the forward power detector for comparing the power emitted by the power amplifier to a power threshold value;
    an integrator, coupled to the comparator and the variable gain amplifier, for increasing a gain value based on a signal received from the comparator;
    a processor coupled to the integrator and the comparator for supplying the power threshold value; and
    said variable gain amplifier receives an intermediate frequency signal and the power amplifier outputs a radio frequency signal.

14. An apparatus recited in claim 13, further comprising:
    a lock detector coupled to the comparator and the processor;
    a digital to analog converter coupled to the processor and the comparator; and
    a second digital to analog converter coupled to the variable gain amplifier and the integrator.

15. An apparatus recited in claim 14, wherein the lock detector determines whether a lock or unlock condition has occurred and provides a result of the determination to the processor.

* * * * *